United States Patent [19]

Thelen et al.

[11] Patent Number: 5,287,070
[45] Date of Patent: Feb. 15, 1994

[54] BALANCED VOLTAGE COMPARATOR

[75] Inventors: Bob Thelen; Donald M. Bartlett, both of Fort Collins, Colo.

[73] Assignee: NCR Corporation, Dayton, Ohio

[21] Appl. No.: 939,225

[22] Filed: Sep. 2, 1992

[51] Int. Cl.$^5$ .............................................. H03F 3/45
[52] U.S. Cl. ..................................... 330/253; 307/355; 330/261
[58] Field of Search ....................... 307/355, 491, 494; 330/253, 261

[56] References Cited

U.S. PATENT DOCUMENTS

| | | | |
|---|---|---|---|
| 4,048,575 | 9/1977 | Musa | 330/257 X |
| 4,459,555 | 7/1984 | Jett, Jr. | 330/253 |
| 4,598,215 | 7/1986 | Schechtman et al. | 307/355 |
| 4,626,713 | 12/1986 | Lee | 307/494 X |
| 4,835,417 | 5/1989 | Kousaka et al. | 307/362 |
| 4,859,928 | 8/1989 | Etheridge | 330/261 X |
| 4,965,468 | 10/1990 | Nicollini et al. | 307/362 |
| 5,132,560 | 7/1992 | Kane | 307/355 |

Primary Examiner—James B. Mullins
Attorney, Agent, or Firm—James H. Beusse

[57] ABSTRACT

A biasing system for a CMOS differential comparator includes a unity gain amplifier for developing a reference voltage corresponding to the trip point of an output inverter. The reference voltage is applied to a voltage to current converter for developing a reference current proportional to the reference voltage. The reference current biases the output inverters at their trip points when the input voltages to the differential comparator are at the same potential. The biasing system includes a reference inverter having characteristics substantially identical to the output inverters. The output and input of the reference inverter are connected together so that a reference voltage is established at the inverter output which is always at the switch point of the inverter. A differential transistor stage includes resistive loads matched in process characteristics and sized to each pass one-half the value of the reference current to reduce the load capacitance at the differential stage. An output stage of the comparator circuit uses a source follower with characteristics matching those of the voltage to current converter so that the output nodes at the source follower have the same value as the reference voltage.

15 Claims, 2 Drawing Sheets

BALANCED VOLTAGE COMPARATOR

BACKGROUND OF THE INVENTION

This invention relates to integrated circuits and, more particularly, to an improved comparator circuit with a novel bias arrangement.

Comparator circuits in integrated circuits such as, for example, a CMOS integrated circuit, are typically configured as a differential amplifier responsive to a difference in voltage between respective inputs to the amplifier. Input and output stages of such comparator circuits are coupled to a constant current source, usually employing current mirror circuits, for providing a constant current to both the common mode terminal of the amplifier and to the output stages. The output stages are coupled to be driven by outputs from the amplifier.

In a conventional CMOS comparator circuit, the differential amplifier uses one stage of the current mirror circuit as a load. The output signals from the differential amplifier drive a common source transistor stage. An inverter is coupled to the output transistor stage to buffer its output. Due to the topology of the conventional comparator circuit, its AC response is limited. The drain and gate capacitance of the current mirror transistors and the gate capacitance of the common source transistor stage slow the circuit response time. Further, since the input common mode voltage determines the output swing of the differential amplifier, the response time is also affected by input common mode voltage. Unsymmetrical drive of the common source stage and output inverter also creates a skew in high-to-low and low-to-high response times.

SUMMARY OF THE INVENTION

It is an object of the present invention to provide a differential comparator circuit having improved response time.

It is another object of the present invention to provide a differential comparator circuit with minimum skew between high-to-low and low-to-high transition times.

The present invention addresses the above mentioned and other disadvantages of the prior art with a novel biasing system for a CMOS differential comparator. In an illustrative form, the biasing system includes a unity gain amplifier for developing a reference voltage corresponding to the trip point of an output inverter. The reference voltage is applied to a voltage to current converter for developing a reference current proportional to the reference voltage. The reference current biases the output inverters at their trip points when the input voltages to the differential comparator are at the same potential. The biasing system further includes a reference inverter having characteristics substantially identical to the output inverters. The output and input of the reference inverter are connected together so that a reference voltage is established at the inverter output which is always at the switch point of the inverter. This reference voltage sets the reference current through the unity gain amplifier.

The comparator circuit further includes a differential transistor stage having resistive loads. The biasing arrangement along with the resistive loads enables the comparator to respond faster, independent of common mode voltage. The resistive loads are matched in process characteristics and sized to each pass one-half the value of the reference current. The resistive loads reduce the load capacitance at the differential stage thereby improving response time. Still further, the output stage of the comparator circuit is preferably formed as a source follower with characteristics matching those of the voltage to current converter so that the output nodes at the source follower have the same value as the reference voltage.

BRIEF DESCRIPTION OF THE DRAWINGS

For a better understanding of the present invention, reference may be had to the following detailed description taken in conjunction with the accompanying drawings in which.

DETAILED DESCRIPTION OF THE INVENTION

Figure 1:
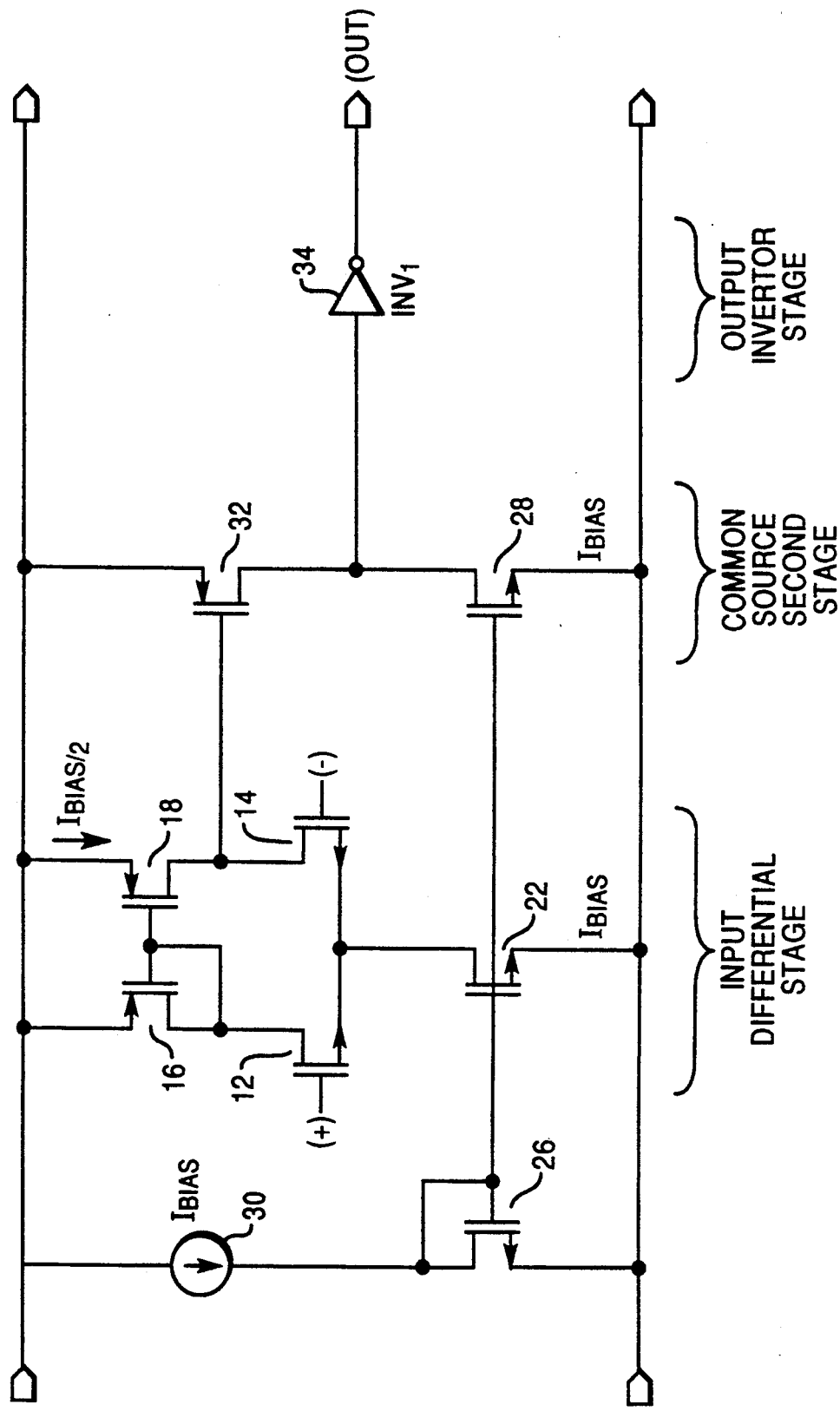
FIG. 1 is a simplified schematic representation of a typical prior art differential comparator circuit.

FIG. 1 is a simplified schematic representation of a CMOS type integrated comparator circuit of known configuration. The comparator input stage comprises a differential stage formed of transistors 12, 14, illustrated as field effect transistors (FET) each having gate, source and drain terminals. Input signals in the form of a voltage are applied to the control or gate terminals for controlling current from the drain to the source terminals, the drain and source terminals comprising load current carrying terminals. A load comprising a current mirror circuit including FET's 16 and 18 is coupled between corresponding drain terminals of FET's 12 and 14 and a positive voltage bus 20. The common node source terminals of FET's 12 and 14 are coupled through a bias current FET 22 to a relatively negative voltage bus 24. The FET 22 is one transistor in another current mirror circuit comprising FET 22 and FET's 26 and 28. The reference current through FET 22 is set by FET 26 and series connected bias device 30,, which device 30 may comprise a resistor, the device 30 and FET 26 being connected between bus 20 and bus 24.

The output signal from the differential stage is taken from a drain terminal of FET 14 and is coupled to a gate terminal of a common source FET 32. FET 32 is connected in a common source configuration with its drain terminal connected to FET 28. An output inverter stage 34 is coupled to the drain terminal of output FET 32. Inverter 34 buffers the output of FET 32.

In operation, device 30 and FET 26 set the bias or reference current, which current is mirrored in FET's 22 and 28. Any difference in the input signals or potentials at the gate terminals of FET's 12 and 14 result in a potential change at the drain terminals of the two transistors. The potential at FET 14 is coupled to FET 32 where the resultant current variation is reflected as a potential change at inverter stage 34. The response time between sensing of the change in signal potential at FET's 12 and 14 and switching of inverter stage 34 is affected by the drain and gate capacitance of the current mirror (FET's 16 and 18) and the capacitance of the common source FET 32 and is of the order of about 10 nanoseconds. The illustrative circuit is also sensitive to input common mode voltage which determines the output swing of the input differential stage. Unsymmetrical drive of the common source stage and the output inverter stage is will result in skew of the high-to-low and low-to-high response times.

Figure 2:
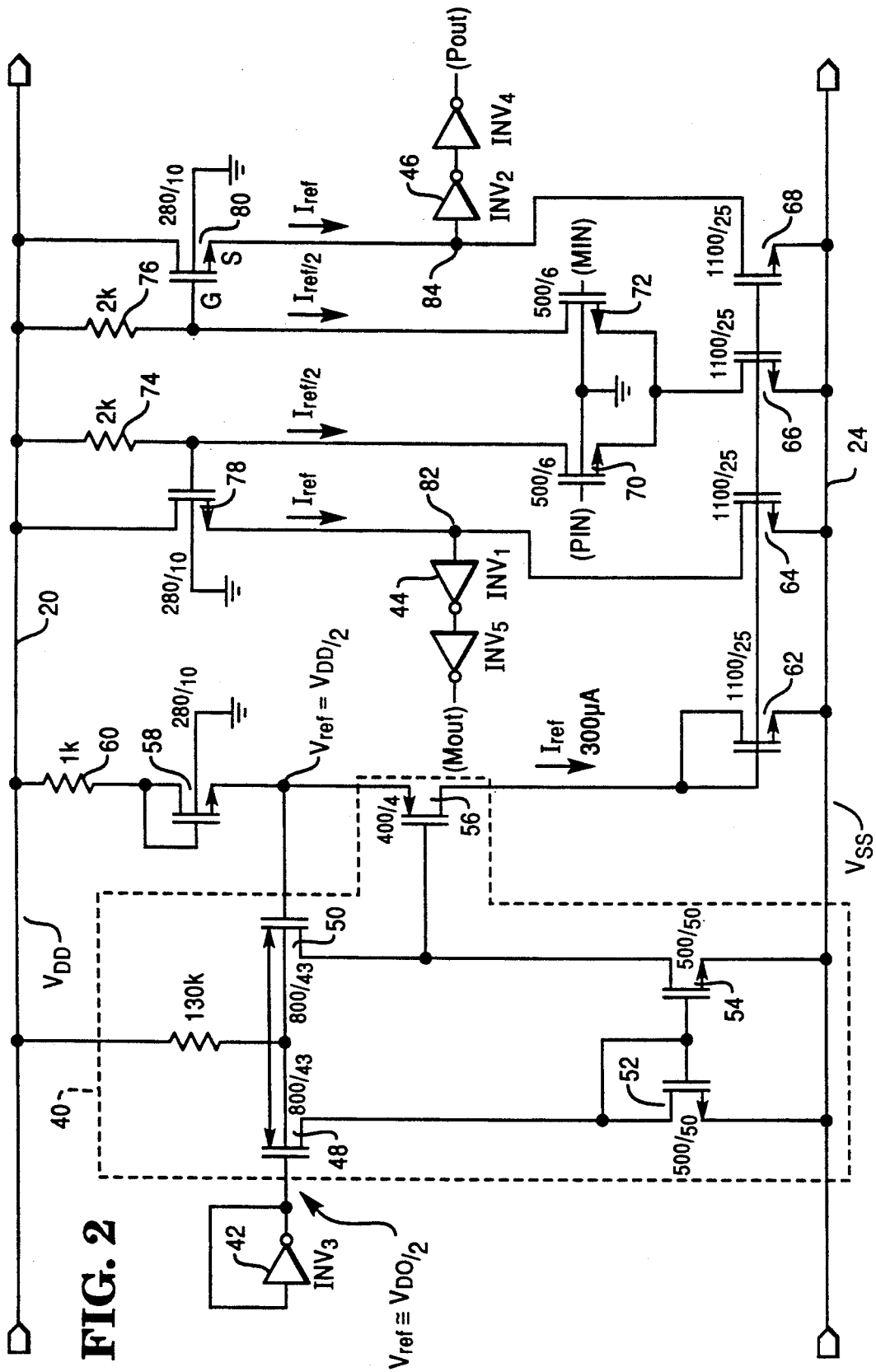
FIG. 2 is a simplified schematic representation of one form of the present invention.

Turning now to FIG. 2 there is shown a preferred embodiment of the present invention. The circuit of FIG. 2 utilizes a biasing circuit comprising unity gain amplifier 40 and input inverter 42 to develop a current proportional to the trip point of output inverters 44 and 46 with this current being used to bias the inverters 44, 46 at their trip point when the comparator inputs are at the same potential. The amplifier 40 comprises transistors 48, 50, 52, 54 and 56 connected such that the potential at the source terminal of transistor 56 (and the gate terminal of transistor 50) is equal to the reference voltage at the output of inverter 42, which output is connected to the gate terminal of transistor 48. The reference voltage, $V_{ref}$, is developed by connecting the input to the output of inverter 42, thus forcing the reference voltage to be set at the trip point of inverter 42. A reference current $I_{ref}$ is developed proportional to $V_{ref}$ by the series connected combination of FET 58 and resistor 60, which combination is coupled between the positive DC bus 20 and $V_{ref}$ at the source terminal of FET 56. Assuming that bus 24 operates at a reference ground potential, i.e., zero volts, designated $V_{ss}$, and that bus 20 is at a selected positive potential designated $V_{DD}$, a typical value for $V_{ref}$ may be $V_{DD}/2$. The value of resistor 60 may be selected to provide a desired value for $I_{ref}$, e.g., 300 micro amps.

Reference current $I_{ref}$, developed at the drain terminal of FET 56, is coupled to a current mirror circuit comprising FET's 62, 64, 66 and 68, which circuit is substantially the same as that of FIG. 1 comprising FET's 22, 26 and 28. FET 66 sets the reference current at $I_{ref}$ for the input differential stage comprising FET's 70 and 72. FET's 64 and 68 set the current reference at $I_{ref}$ for each of a corresponding one of a pair of output stages. Capacitance in the input stage is reduced by eliminating the current mirror load (illustrated in FIG. 1 as FET's 16, 18) and replacing it with load resistors 74 and 76, connected, respectively, in series circuit with FET's 70 and 72. Each of the resistors 74, 76 is selected to be twice the value of resistor 60 and matched in process characteristics such that one-half the value of $I_{ref}$, assuming equal drive potential at the gate terminals of the input differential stage, passes through each FET 70, 72.

The output potentials developed at the drain terminals of FET's 70, 72 are coupled to respective gate terminals of FET's 78 and 80, the latter FET's being connected as source followers serially coupled to current mirror FET's 64 and 68, respectively. The FET's 78 and 80 are matched to FET 58 so that the output nodes 82 and 84 at the source terminals of FET's 78 and 80 have the same value as the reference voltage $V_{ref}$. Since the output inverters 44 and 46 are connected to nodes 82 and 84, matching the characteristics of inverters 44 and 46 to those of inverter 42 assures that the output inverters 44, 46 are biased at their trip points.

The above described biasing arrangement improves the AC response time of the CMOS integrated circuit differential comparator to about two nanoseconds by reducing the load capacitance in both the input and output stages. Input capacitance is reduced by use of resistive loading. Output capacitance is reduced by applying a constant gate- to-source voltage to the source follower output FET's 78 and 80. The resistive loads 74 and 76 assure that the output potential swing at the drain terminals of FET's 70 and 72 is only a function of the differential input voltage and not the common mode voltage. Skew in the circuit response times is reduced since the output voltage is forced to be symmetrical by the resistive loads and the limited current that can be steered to each resistive load. The source followers 78, 80 maintain this symmetry and produce a symmetrical drive, about the pre-established trip point, to the inverters 44, 46. Further, the inverters 44 and 46 are biased at their trip points by matching their characteristics to those of the inverter 42 and connecting inverter 42 to set a voltage reference precisely at its trip point. Accordingly, the illustrative comparator not only operates faster with less skew but is more responsive to small differential input signal variations.

For purposes of description, the components 60, 74 and 76 have been described as resistors. The use of the term "resistor" is not intended to be limited to conventional resistors but is intended to include devices commonly used in integrated circuit technology as resistor substitutes. In particular, in CMOS integrated circuits, it is common to use a transistor having a gate terminal connected to a load terminal, i.e., connected in a diode configuration, to emulate a resistive load, and the term resistor as used herein is intended to include such configurations.

While the invention has been described in what is considered to be a preferred embodiment, other variations and modifications will become apparent to those skilled in the art. It is intended, therefore, that the invention not be limited to the illustrative embodiment but be interpreted within the full spirit and scope of the appended claims.

What is claimed is:

1. A differential comparator circuit comprising:

a constant current source;

differential input means including at least a first and a second transistor having a commonly connected load current carrying terminal, each of said transistors further having a signal input terminal and another load current carrying terminal;

current mirror means having a plurality of transistor mirror stages, at least one of said stages being coupled to said constant current source and another of said stages being coupled in circuit with said commonly connected load current carrying terminal of said differential input means;

output transistor means having an output terminal coupled to another of said stages of said current mirror means and an input terminal coupled to said another load carrying terminal of one of said first and second transistors; and first and second resistors connected in series circuit arrangement with said first and second transistors, respectively.

2. The circuit of claim 1 and further including:

another output transistor means having an output terminal coupled to yet another of said stages of said current mirror means and having an input terminal coupled to said another load carrying terminal of another of said first and second transistors.

3. The circuit of claim 1 wherein said constant current source comprises:

a unity gain amplifier including a first inverter having an input terminal connected to an output terminal of said inverter;

a bias amplifier having an input terminal coupled to said output terminal of said first inverter and having an output terminal for developing a voltage reference substantially equal to a voltage at said output terminal of said inverter;

a reference current source comprising a series connected transistor and a bias resistor, said reference current source being coupled between a source of direct current electric power and said output terminal of said bias amplifier; and means coupling said reference current source to said current mirror means.

4. The circuit of claim 3 wherein said first and second resistors each have an ohmic resistance twice that of said bias resistor.

5. The circuit of claim 3 and further including a second inverter having an input terminal coupled to said output terminal of said output transistor means, said second inverter having matching characteristics with said first inverter such that said second inverter is biased at its trip point.

6. A CMOS integrated circuit differential comparator having improved response time comprising:

an input differential circuit comprising at least a first and a second transistor each having a resistive load serially connected with a load current carrying terminal of each transistor;

at least one source follower transistor having a gate terminal coupled to the load current carrying terminal of one of said first and second transistors;

biasing means for setting a constant bias voltage at a source terminal of said source follower for establishing a constant gate-to-source voltage on said source follower; and means coupled in circuit with each of said input circuit and said source follower transistor for establishing a constant current through each of said circuit and said source follower transistor.

7. The comparator of claim 6 and including a first inverter connected to said source terminal of said source follower, said constant bias voltage being established at a trip point of said first inverter.

8. The comparator of claim 7 and including a bias circuit for setting said constant bias voltage, said bias circuit comprising a second inverter having an output terminal and an input terminal, said output and input terminals being coupled one to the other.

9. The comparator of claim 8 wherein said first inverter is selected to have matching characteristics with said second inverter for setting said bias voltage at said source follower to the trip point of said second inverter.

10. An integrated circuit differential comparator having improved response time comprising:

an input differential circuit comprising at least a first and a second transistor each having a load serially connected with a load current carrying terminal of each transistor;

at least one source follower transistor having a gate terminal coupled to the load current carrying terminal of one of said first and second transistors;

biasing means for setting a constant bias voltage at a source terminal of said source follower for establishing a constant gate-to-source voltage on said source follower; and means coupled in circuit with each of said input circuit and said source follower transistor for establishing a constant current through each of said circuit and said source follower transistor.

11. The comparator of claim 10 and including a first inverter connected to said source terminal of said source follower, said constant bias voltage being established at a trip point of said first inverter.

12. The comparator of claim 11 and including a bias circuit for setting said constant bias voltage, said bias circuit comprising a second inverter having an output terminal and an input terminal, said output and input terminals being coupled one to the other.

13. The comparator of claim 12 wherein said first inverter is selected to have matching characteristics with said second inverter for setting said bias voltage at said source follower to the trip point of said second inverter.

14. A method for improving response time of a differential comparator, the comparator including a differential transistor stage having an output terminal coupled through a buffer stage to an output inverter, the method comprising the steps of:

developing a reference voltage corresponding to a trip point of the output inverter;

developing a reference current proportional to the reference voltage;

biasing the output inverter at the trip point with the reference current; and maintaining a constant current through each of the comparator and buffer stage.

15. The method of claim 14 wherein the differential transistor stage includes at least two transistors, each transistor being coupled in circuit with a corresponding one of a pair of loads, the method comprising the further steps of:

selecting the loads to have substantially matching process characteristics and resistive characteristics; and passing one-half of the reference current through each of the loads when the differential stage is in a balanced state.

* * * * *